United States Patent
Lee et al.

(10) Patent No.: US 9,100,054 B2
(45) Date of Patent: Aug. 4, 2015

(54) DATA PROCESSING SYSTEMS AND METHODS PROVIDING ERROR CORRECTION

(75) Inventors: Kijun Lee, Seoul (KR); Junjin Kong, Yongin-si (KR); Sejin Lim, Seoul (KR); Jaehong Kim, Seoul (KR); Hong-Rak Son, Anyang-si (KR); Yong-June Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 183 days.

(21) Appl. No.: 13/414,002

(22) Filed: Mar. 7, 2012

(65) Prior Publication Data

US 2012/0233518 A1    Sep. 13, 2012

(30) Foreign Application Priority Data

Mar. 10, 2011   (KR) ........................ 10-2011-0021436

(51) Int. Cl.
| | |
|---|---|
| H03M 13/29 | (2006.01) |
| H03M 13/37 | (2006.01) |
| H03M 13/33 | (2006.01) |
| H03M 13/09 | (2006.01) |
| H03M 13/11 | (2006.01) |
| H03M 13/15 | (2006.01) |

(52) U.S. Cl.
CPC ...... H03M 13/2906 (2013.01); H03M 13/2933 (2013.01); H03M 13/3738 (2013.01); *H03M 13/09* (2013.01); *H03M 13/1102* (2013.01); *H03M 13/152* (2013.01); *H03M 13/1515* (2013.01); *H03M 13/2957* (2013.01)

(58) Field of Classification Search
CPC ............ H03M 13/2957; H03M 13/29; H03M 13/116; H03M 13/23; H03M 13/09; H03M 13/41; H03M 13/2906; H03M 13/2933; H03M 13/3738; H03M 13/1102; H03M 13/1515; H03M 13/152; H04L 1/0057; H04L 1/0059; H04L 1/0061; H04L 1/0045; G06F 11/1076; G06F 11/1008
See application file for complete search history.

(56) References Cited

U.S. PATENT DOCUMENTS 5,307,377 A *   4/1994   Chouly et al. ................ 375/261
7,047,476 B2   5/2006   Nagai et al.
(Continued)

FOREIGN PATENT DOCUMENTS

JP    10093447 A *   4/1998   .......... H03M 13/022
JP    2004-022130     1/2004
(Continued)

*Primary Examiner* — April Y Blair
*Assistant Examiner* — Dipakkumar Gandhi
(74) *Attorney, Agent, or Firm* — Myers Bigel Sibley & Sajovec, P.A.

(57) ABSTRACT

A method may be provided to detect and correct data errors in a data system where a data message has been encoded with outer parity bits based on the data message using an outer encoding technique to provide an outer codeword and with inner parity bits based on the outer codeword using an inner encoding technique different than the outer encoding technique to provide an inner codeword. The method may include using the inner parity bits and an inner decoding technique corresponding to the inner encoding technique to perform inner decoding of the inner codeword. Responsive to performing inner decoding of the inner codeword without error, the data message may be extracted from a result of inner decoding the inner codeword without using the outer parity bits to decode the result of inner decoding the inner codeword. Related systems are also discussed.

11 Claims, 14 Drawing Sheets

(56) References Cited

U.S. PATENT DOCUMENTS

| | | |
|---|---|---|
| 7,568,147 B2 * | 7/2009 | Eidson et al. .............. 714/786 |
| 2005/0022095 A1 * | 1/2005 | Lee .............................. 714/759 |
| 2005/0268205 A1 * | 12/2005 | Rhee et al. .................. 714/758 |
| 2009/0089492 A1 * | 4/2009 | Yoon et al. .................. 711/103 |
| 2009/0241008 A1 | 9/2009 | Kim et al. |
| 2009/0249160 A1 * | 10/2009 | Gao et al. ................... 714/752 |
| 2009/0271686 A1 * | 10/2009 | Jiang et al. ................. 714/784 |

FOREIGN PATENT DOCUMENTS

| | | |
|---|---|---|
| KR | 100205431 | 4/1999 |
| KR | 102004002628 | 1/2004 |
| KR | 1020090099757 | 9/2009 |

\* cited by examiner

DATA PROCESSING SYSTEMS AND METHODS PROVIDING ERROR CORRECTION

CROSS-REFERENCE TO RELATED APPLICATIONS

This application claims the benefits, under 35 U.S.C §119, of Korean Patent Application No. 10-2011-0021436 filed Mar. 10, 2011, the entire disclosure of which is incorporated by reference herein.

BACKGROUND

Examples of embodiments relate to data processing systems, and more particularly, relate to decoders of data processing systems and error correction code processing methods thereof.

A path for transferring information is typically defined as a channel. If information is transferred by wired communication, a channel is formed by a transmission line through which information is sent. If information is transferred by wireless communication, a channel is formed of air through which electromagnetic waves pass.

A channel can be defined by a process where data is stored in a data storage device and the stored data is read out from the data storage device. In this case, the channel can be defined by a time lapse from a time when data is stored in the data storage device until a time when stored data is read out from the data storage device. Further, the channel can be defined by a physical path through which data is stored in the data storage device and through which stored data is read out from the data storage device.

Data may be contaminated when transferred via a channel. That is, data errors may arise while data is being transferred via the channel. Research on devices and methods to recover original data by detecting and removing data errors is being conducted.

An error control code or error correction code may be added to data before the data is transferred, and this may be referred to as "error correction code encoding". Further, after transfer data is received, data and an error correction code added to the data may be separated from the transfer data, and this may be referred to as "error correction code decoding".

Error rates of channels may differ according to their characteristics. If an error rate is large, a required error correction code encoding and decoding may become complicated in hardware or software.

SUMMARY

One aspect of embodiments of inventive concepts is directed to provide a data processing system comprising a plurality of memory channels storing data, and a concatenated decoder detecting and correcting errors of inner words and outer words transferred from the plurality of memory channels. The concatenated decoder may include an inner decoder decoding the inner words to output the outer words each formed of a message and parity data on the message, an outer decoder decoding the outer words to output decoded messages to an external device, and a decoder controller controlling the inner decoder and the outer decoder. If a decoding operation of the inner decoder is performed successfully, the decoder controller extracts the messages from the outer words to the messages to the external device.

In these embodiments, the decoder controller may provide the outer words to the outer decoder when the decoding operation of the inner decoder fails.

In these embodiments, the inner decoder may be formed of a plurality of inner decoders each corresponding to the memory channels, and the outer decoder may be formed of outer decoders, the number of the outer decoders being less than that of the memory channels.

In these embodiments, the decoder controller may decide a decoding order according to a priority of the outer words, and may provide the outer words to the outer decoders according to the decoding order.

In these embodiments, a decoding manner of the inner decoder may be different from that of the outer decoder.

In these embodiments, the inner decoder may use a BCH code, an RS code, a convolutional code, an LDPC code, and/or a turbo code.

In these embodiments, the outer decoder may use a BCH code, an RS code, and/or a CRC code.

In these embodiments, if the decoding operation of the inner decoder fails, the decoder controller may provide an output of the inner decoder to an input of the inner decoder, and the inner decoder may iteratively perform the decoding operation by a maximum loop number according to a decoding manner.

In these embodiments, the concatenated decoder may further include an error detecting unit, and the error detecting unit may check whether errors of the outer words output from the inner decoder are corrected normally.

In these embodiments, if a checking result of the error detecting unit indicates that an error correction operation fails, the decoder controller may provide the outer words to the outer decoder.

In these embodiments, the data processing system may further include a concatenated encoder encoding data to be transferred respectively through the memory channels, wherein the concatenated encoder includes an outer encoder generating outer codewords by encoding data to be transferred respectively via the memory channels. An inner encoder may generate inner codewords by encoding the outer codewords.

Other aspect of embodiments of inventive concepts may be directed to provide an error correction code processing method of a data processing system. An outer word may be output by detecting and correcting an error of an inner word transferred from a memory channel. Whether the detecting and correcting an error of an inner word is performed successfully may be judged. If the detecting and correcting an error of an inner word fails, a decoded message may be output by detecting and correcting an error of the outer word. If the detecting and correcting an error of an inner word is performed successfully, a message may be extracted from the outer word to output the message to an external device without the detecting and correcting an error of the outer word.

In these embodiments, detecting and correcting an error of an inner word may be performed in a manner different from the detecting and correcting an error of an outer word.

In these embodiments, if the detecting and correcting an error of an inner word fails, detecting and correcting an error of an inner word may be performed iteratively by a predetermined number.

In these embodiments, the error correction code processing method may further comprise judging whether the detecting and correcting an error of an inner word is performed normally. If detecting and correcting an error of an inner word fails, detecting and correcting an error of an outer word may be performed.

According to some embodiments, a data processing system may include a plurality of memory channels configured to store data and a concatenated decoder coupled to the plurality of memory channels. The concatenated decoder may be configured to detect and correct errors of inner words and outer words transferred from the plurality of memory channels. The concatenated decoder may include an inner decoder configured to decode the inner words to output the outer words each formed of a message and parity data on the message, and an outer decoder configured to decode the outer words to output decoded messages to an external device. In addition, a decoder controller may be configured to control the inner and outer decoders with the decoder controller being configured to extract the messages from the outer words to output the messages to the external device without processing through the outer decoder when a decoding operation of the inner decoder is performed successfully.

According to some other embodiments, an error correction code processing method may be provided for a data processing system. The method may include generating an outer word by detecting and correcting an error of an inner word transferred from a memory channel, and judging whether the detecting and correcting the error of the inner word is performed successfully. If the detecting and correcting an error of an inner word fails, a decoded message may be generated by detecting and correcting an error of the outer word. If the detecting and correcting the error of the inner word is performed successfully, a message may be extracted from the outer word to output the message to an external device without detecting and correcting an error of the outer word.

According to still other embodiments, a method may be provided to detect and correct data errors in a data system where a data message has been encoded with outer parity bits based on the data message using an outer encoding technique to provide an outer codeword and with inner parity bits based on the outer codeword using an inner encoding technique different than the outer encoding technique to provide an inner codeword. The method may include using the inner parity bits and an inner decoding technique corresponding to the inner encoding technique to perform inner decoding of the inner codeword. Responsive to performing inner decoding of the inner codeword without error, the data message may be extracted from a result of inner decoding the inner codeword without using the outer parity bits to decode the result of inner decoding the inner codeword.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
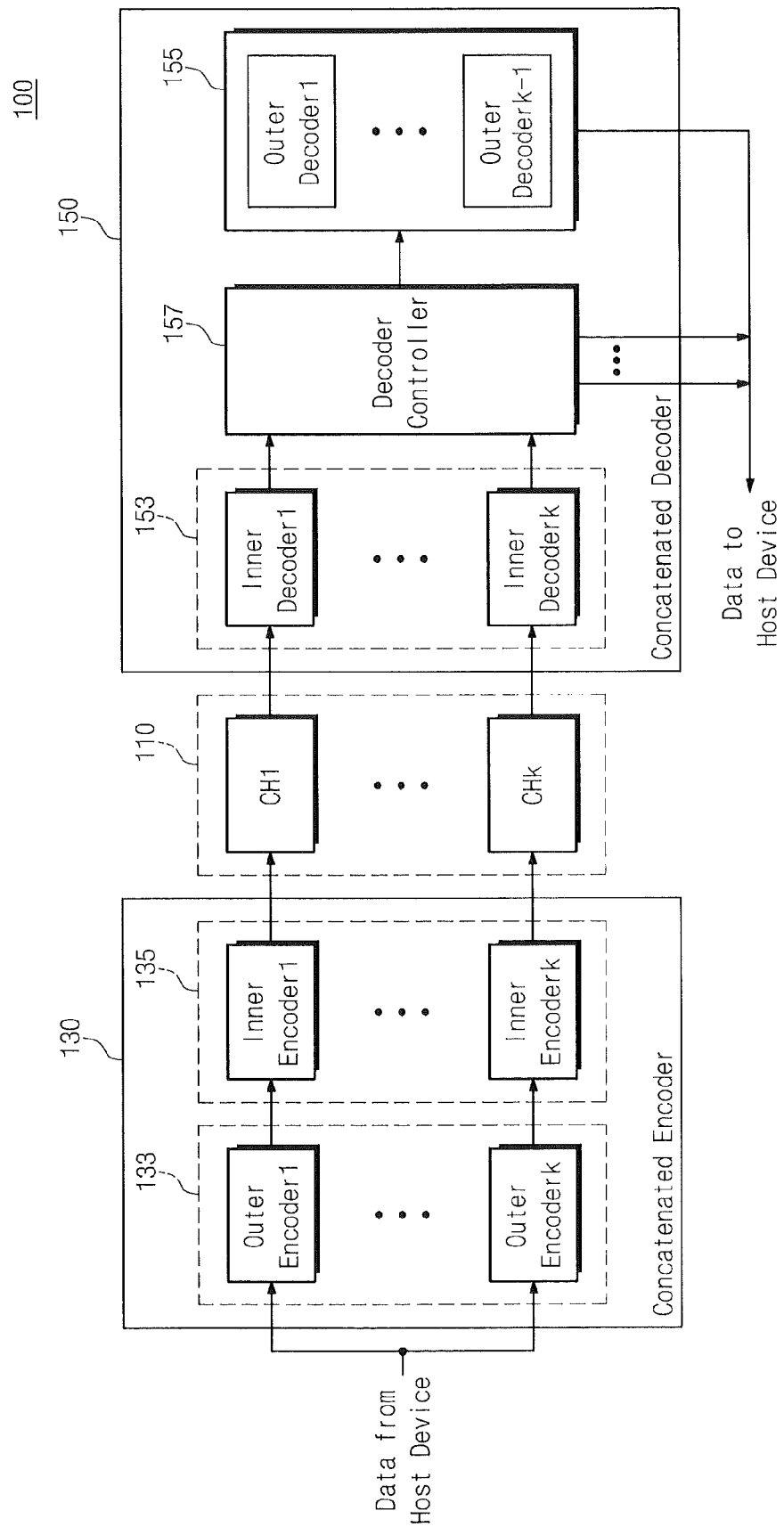
FIG. 1 is a block diagram of a data processing system including a concatenated decoder according to first embodiments of inventive concepts.

Inventive concepts are described more fully hereinafter with reference to the accompanying drawings, in which embodiments of inventive concepts are shown. These inventive concepts may, however, be embodied in many different forms and should not be construed as limited to embodiments set forth herein. Rather, these embodiments are provided so that this disclosure will be thorough and complete, and will fully convey the scope of inventive concepts to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when an element, component, or layer is referred to as being "between" two other elements, components, or layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element or layer is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

An error correction code processing method of a decoder according to examples of some embodiments of inventive concepts will be described using a data processing system such as a data storage system or a memory system. But, the error correction code processing method is not limited thereto. For example, error correction code processing methods discussed herein may be applied to systems having various channels such as a wire channel, a wireless channel, a memory channel, a data storage channel, an optical channel, etc.

FIG. 1 is a block diagram of a data processing system including a concatenated decoder according to first embodiments of inventive concepts. Data processing system 100 may include a concatenated encoder 130 which is configured to encode information (data or a message) in a concatenated code manner. Further, the data processing system 100 may include a concatenated decoder 150 which is configured to decode information (data or a message) in a concatenated code manner.

In error correction code encoding and decoding, data before encoding is called a message, and data (i.e., including error correction code added data) after encoding is called a codeword. In a concatenated code manner, a codeword is generated by adding a concatenated code formed of an inner code and an outer code to improve performance of an error correction code and to make up for a characteristic weakness of a single code. For a brief explanation, embodiments of inventive concepts will be described assuming that a codeword is formed on one inner code and one outer code. A concatenated code can be formed of two or more codes according to the number of inner and outer encoders within the concatenated encoder 130 and according to the number of inner and outer decoders within a concatenated decoder 150.

The concatenated encoder 130 receives data from a host device and encodes the received information according to a concatenated code manner. The concatenated encoder 130 includes an outer encoder 133 and an inner encoder 135. Herein, an encoder adjacent to the host device is called the outer encoder 133, and an encoder adjacent to a transfer path 110 is called the inner encoder 135.

The outer encoder 133 is formed of encoders each assigned to channels of the transfer path 110. For example, if the data processing system 100 includes k channels, the outer encoder 133 is formed of k encoders. The inner encoder 135 is formed of encoders each assigned to the channels 110. For example, if the data processing system 100 includes k channels, the inner encoder 135 is formed of k encoders.

The outer encoder 133 generates an outer codeword by encoding input information according to a first encoding method. The inner encoder 135 generates an inner codeword by encoding an output (i.e., is the outer codeword) of the outer encoder 133 according to a second encoding method. The inner codeword generated by the inner encoder 135 is sent to the transfer path 110.

Encoded data (e.g., an inner codeword) output from the concatenated encoder 130 is transferred to the concatenated decoder 150 via the transfer path 110. By way of example, the transfer path 110 may include a memory channel or a data storage channel. Each of channels CH1 to CHk of the transfer path 110 may include a plurality of storage devices. Storage devices included in each channel may share the concatenated encoder 130 and the concatenated decoder 150.

The concatenated decoder 150 receives data (i.e., encoded data or encoded data including an error or errors) transferred via the transfer path 110 and decodes the received data (i.e., encoded data). The concatenated decoder 150 includes an inner decoder 153 and an outer decoder 155. Further, the concatenated decoder 150 includes a decoder controller 157 to control an operation of the concatenated decoder 150.

The inner decoder 153 may be formed of decoders each assigned to channels of the transfer path 110. For example, if the data processing system 100 includes k channels, the inner decoder 153 includes k decoders. The number of decoders within the outer decoder 155 may be less the number of channels CH1 to CHk of the transfer path 110. If the data processing system 100 includes k channels, the outer decoder 155 may be formed of (k−1) decoders. That is, decoders of the outer decoder 155 do not correspond to the channels CH1 to CHk of the transfer path 110, respectively.

In an example of embodiments of inventive concepts, data input to the inner decoder 153 is called an inner word, and data input to the outer decoder 155 is called an outer word. The outer word may be data provided to the outer decoder 155 from the inner decoder 153.

The inner decoder 153 operates by decoding input data (i.e., encoded data) according to an encoding method used by the inner encoder 135. The outer decoder 155 generates a message (i.e., data before encoding) by decoding an output (i.e., an outer word) of the inner decoder 153 according to an encoding method used by the outer decoder 133. The outer decoder 155 sends the message (i.e., data for encoding) to the host device.

In accordance with some examples of embodiments of inventive concepts, a decoding operation of the outer decoder 155 may be skipped according to a decoding result of the inner decoder 153. If an error is not detected from data decoded by the inner decoder 153 or if an error is correctable, the decoder controller 157 controls an output (i.e., an outer word) of the inner decoder 153 so as not to be transferred to the outer decoder 155. At this time, the decoder controller 157 extracts a message (i.e., data before encoding) from an outer word to send it to the host device. Further, in the event that an error of data decoded by the inner decoder 153 is not corrected, the decoder controller 157 controls an output (i.e., an outer word) of the inner decoder 153 so as to be decoded by any one of decoders of the outer decoder 155. As described above, the number of decoders of the outer decoder 155 is less than that of channels of the transfer path 110. That is, the decoders of the outer decoder 155 are not assigned to the channels of the transfer path 110, respectively. Accordingly, it is possible to simplify the concatenated decoder 150.

Figure 2:
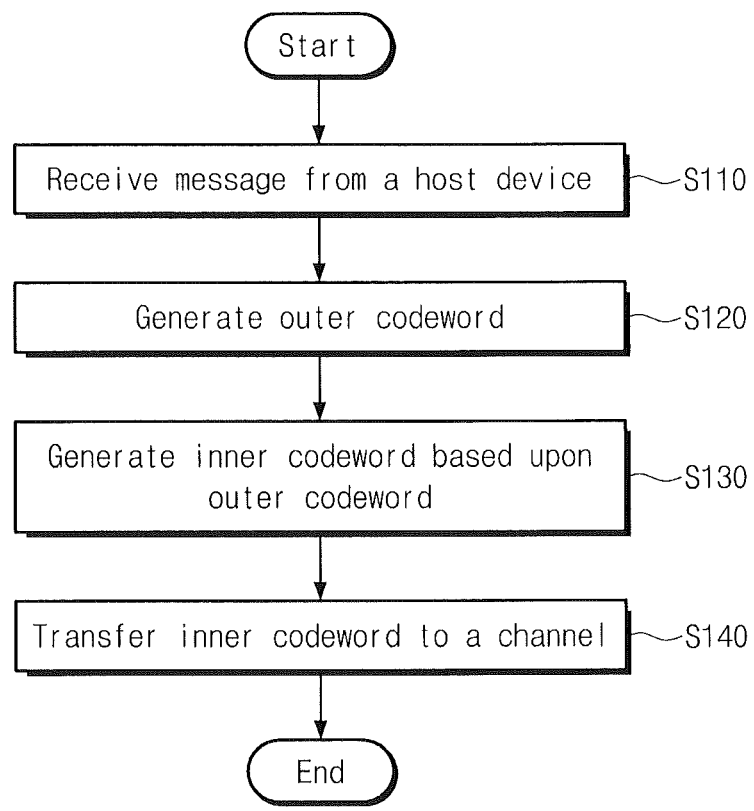
FIG. 2 is a flowchart of encoding operations of a concatenated encoder according to example embodiments of inventive concepts.
Figure 3:
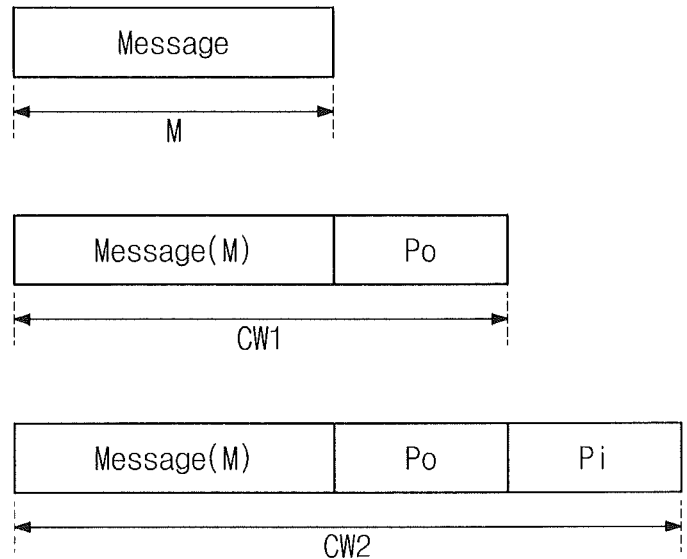
FIG. 3 is a diagram showing a codeword generated according to an encoding operation of a concatenated encoder of FIG. 2.

FIG. 2 is a flowchart of encoding operations of a concatenated encoder according to some examples of embodiments of inventive concepts. FIG. 3 is a diagram showing a codeword generated according to an encoding operation of a concatenated encoder in FIG. 2. Below, an encoding operation of a concatenated encoder according to some examples of embodiments of inventive concepts will be more fully described with reference to accompanying drawings.

In operation S110, a concatenated encoder 130 receives data (i.e., a message) from an external device (e.g., a host device). The received data, that is, the message is provided to an outer encoder 133. In operation S120, the outer encoder 133 generates an outer codeword on the received message. The outer encoder 133 may generate a first codeword CW1 as illustrated in FIG. 3. The first codeword CW1, that is, the outer codeword is formed of the message M and outer parity data Po generated by encoding the message M.

In operation S130, an inner encoder 135 generates an inner codeword based upon the first codeword CW1, that is, the outer codeword. That is, the inner encoder 135 may generate a second codeword CW2 as illustrated in FIG. 3. The second codeword CW2, that is, the inner codeword is formed of the message M, the outer parity data Po, and inner parity data Pi generated by encoding the message M and outer parity data Po.

In operation S140, the inner encoder 135 sends the second codeword CW2, that is, the inner codeword to a transfer path 110. By way of example, the transfer path 110 may include a storage means capable of storing data transferred from the concatenated encoder 130 permanently or temporarily. For example, the transfer path 110 may include one or more memory devices. As another example, the transfer path 110 may include of one or more flash memory devices.

One of various encoding methods classified according to an encoding performance or encoding method (e.g., an error correction capacity or an iterative method) may be used as an encoding method of the outer encoder 133 and the inner encoder 135. According to some examples of embodiments of inventive concepts, the outer encoder 133 may be configured to use a BCH (Bose, Chaudhuri, Hocquenghem) code, an RS (Reed-Solomon) code, a CRC (cyclic redundancy check) code, etc., which are known as block codes. The inner encoder 135 may be configured to use a BCH code, an RS code, a convolutional code, an LDPC (low density parity check) code, a turbo code, etc.

Figure 4:
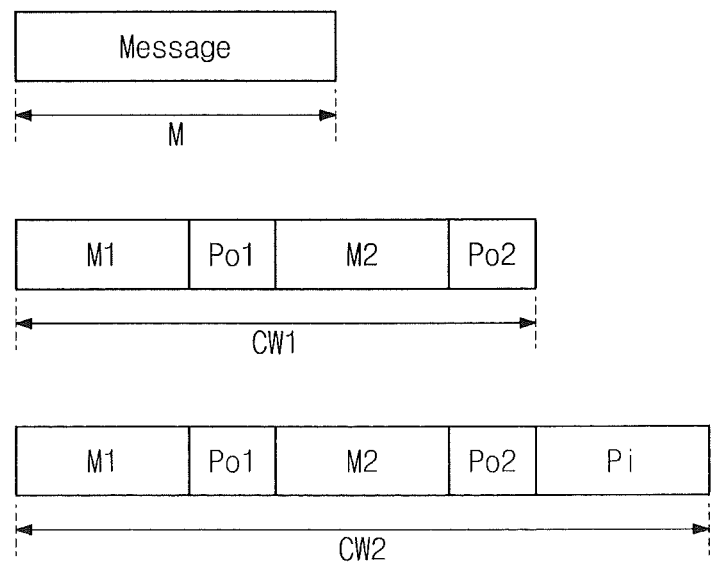
FIG. 4 is a diagram showing another codeword according to an operation of a concatenated encoder of FIG. 2.

FIG. 4 is a diagram showing another codeword according to an operation of a concatenated encoder in FIG. 2. Referring to FIG. 4, an outer codeword may be generated by separating a message M into two portions M1 and M2, which will be more fully described below.

As illustrated in FIG. 4, an outer encoder 133 may divide input data, that is, a message M into two portions. For ease of explanation, it is assumed that the message M is divided into two portions, but the message M may be divided into N portions (N being an integer of 2 or more) for encoding. After the message M is divided into two portions M1 and M2, the outer encoder 133 generates outer parity data Po1 and Po2 by encoding the two message portions M1 and M2, respectively. The outer encoder 133 may generate a first codeword CW1 as illustrated in FIG. 4. The first codeword CW1, that is, an outer codeword may be formed of the divided message portions M1 and M2 and outer parity data Po1 and Po2 generated by encoding the divided message portions M1 and M2, respectively.

An inner encoder 135 generates an inner codeword based upon the first codeword CW1, that is, the outer codeword. That is, the inner encoder 135 generates a second codeword CW2 as illustrated in FIG. 4. The second codeword CW2, that is, an inner codeword may be formed of the divided message portions M1 and M2, the outer parity data Po1 and Po2, and inner parity data Pi generated by encoding the divided message portions M1 and M2 and the outer parity data Po1 and Po2.

Figure 5:
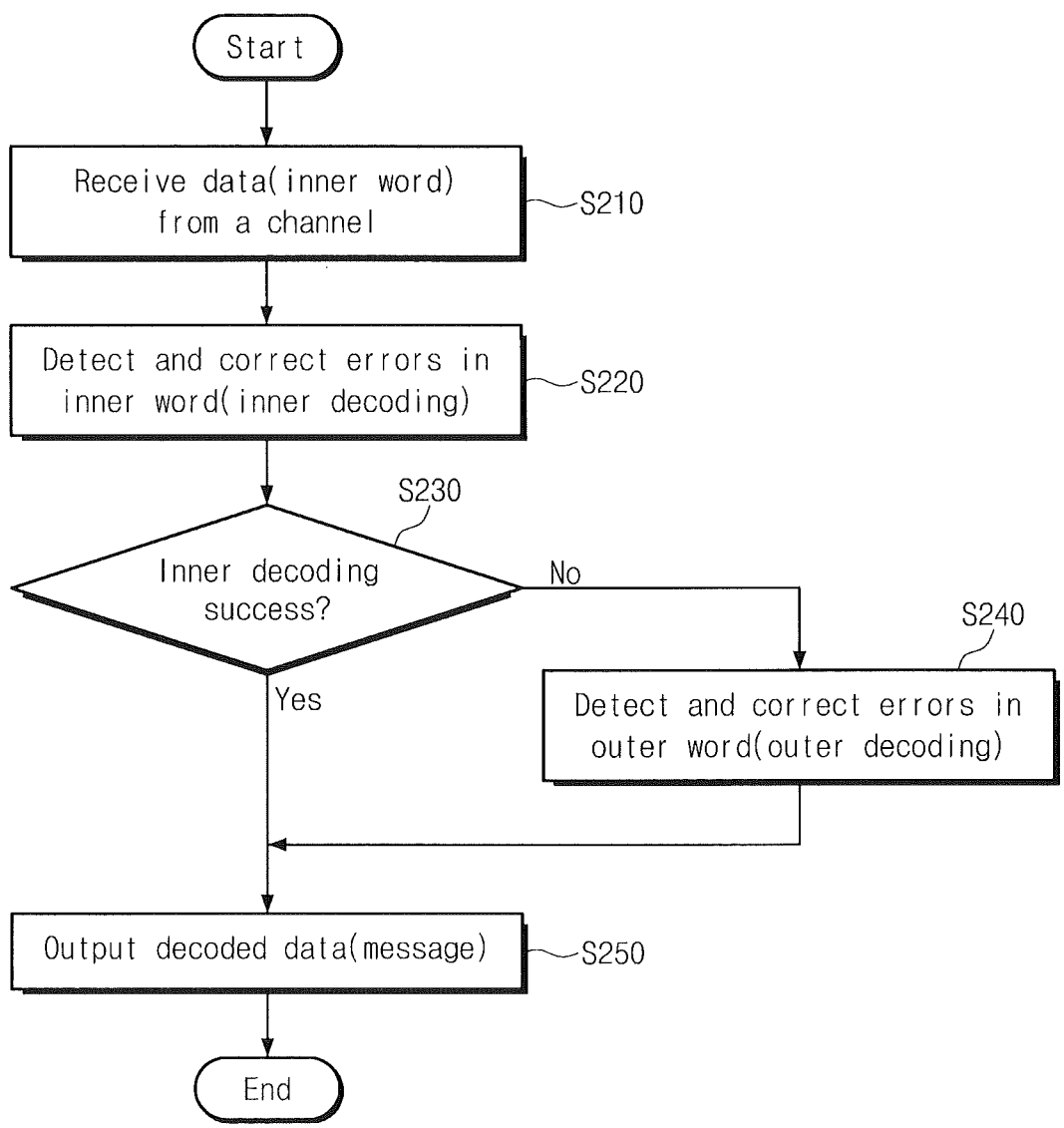
FIG. 5 is a flowchart illustrating decoding operations of a concatenated decoder according to examples of embodiments of inventive concepts.
Figure 6:
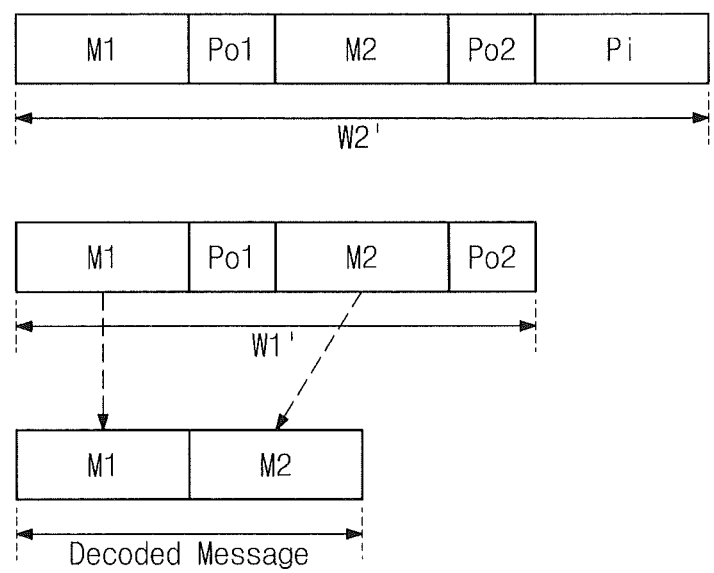
FIG. 6 is a diagram of message decoding according to decoding operations of a concatenated decoder in FIG. 5.

FIG. 5 is a flowchart illustrating decoding operations of a concatenated decoder according to some examples of embodiments of inventive concepst. FIG. 6 is a diagram of a message decoding process according to decoding operations of a concatenated decoder in FIG. 5. Below, decoding operations of a concatenated decoder according to some examples of embodiments of inventive concepts will be more fully described with reference to accompanying drawings.

In operation S210, data including an error is provided to an inner encoder 153 from a transfer path 110 (or, a channel thereof). In operation S220, the inner decoder 153 decodes input data, that is, inner word. For example, the inner decoder 153 detects and corrects errors of divided message portions M1 and M2 based on inner parity data P1. This operation will be referred to as an inner decoding operation.

As illustrated in FIG. 6, the inner decoder 153 outputs error-corrected data, that is, a first word W1' error corrected to a decoder controller 157 as a decoding result. In operation S230, the decoder controller 157 controls a following decoding operation according to whether a decoding result of the inner decoder 153 is successful.

In the event that no error is detected from data decoded by the inner decoder 153 or that the detected error is correctable, the decoder controller 157 controls such that an output of the inner decoder 153, that is, an outer word is not provided to an outer decoder 155. Afterwards, in operation S250, the decoder controller 157 gathers message portions M1 and M2 from the outer word, that is, the first word W1' error corrected and provides it to an external device (e.g., a host device) as decoded data (i.e., a message), as illustrated in FIG. 6.

In the event that an error of data decoded by the inner decoder 153 is uncorrectable, the decoder controller 157 provides the output of the inner decoder 153, that is, the outer word to an outer decoder 155. The outer decoder 155 decodes input outer word, that is, the first word W1' uncorrectable, in operation S240. For example, the outer decoder 155 detects and corrects errors of divided message portions M1 and M2 based upon outer parity data Po1 and Po2 of the divided message portions M1 and M2. This operation will be referred to as an outer decoding operation. Afterwards, in operation S250, the outer decoder 155 outputs decoded data (i.e., a message) to the external device (e.g., the host device) as illustrated in FIG. 6.

In the outer decoding operation, the decoder controller 157 may determine a decoding order of outer words. Afterwards, the decoder controller 157 may provide an outer word W1' to any decoder within the outer decoder 155 according to a priority. In other words, the outer word W1' output from an inner decoder assigned to a channel CHi (i being 1 to k) may be decoded by any decoder within the outer decoder 155. For this reason, the number of decoders within the outer decoder 155 may be less than the number of channels of the transfer path 110 or that of decoders within the inner decoder 153. Accordingly, it is possible to simplify a concatenated decoder 150.

In the outer decoding operation, if an error of the outer word is uncorrectable, the outer decoder 155 may notify the outer device (e.g., the host device) of a decoding error.

Figure 7:
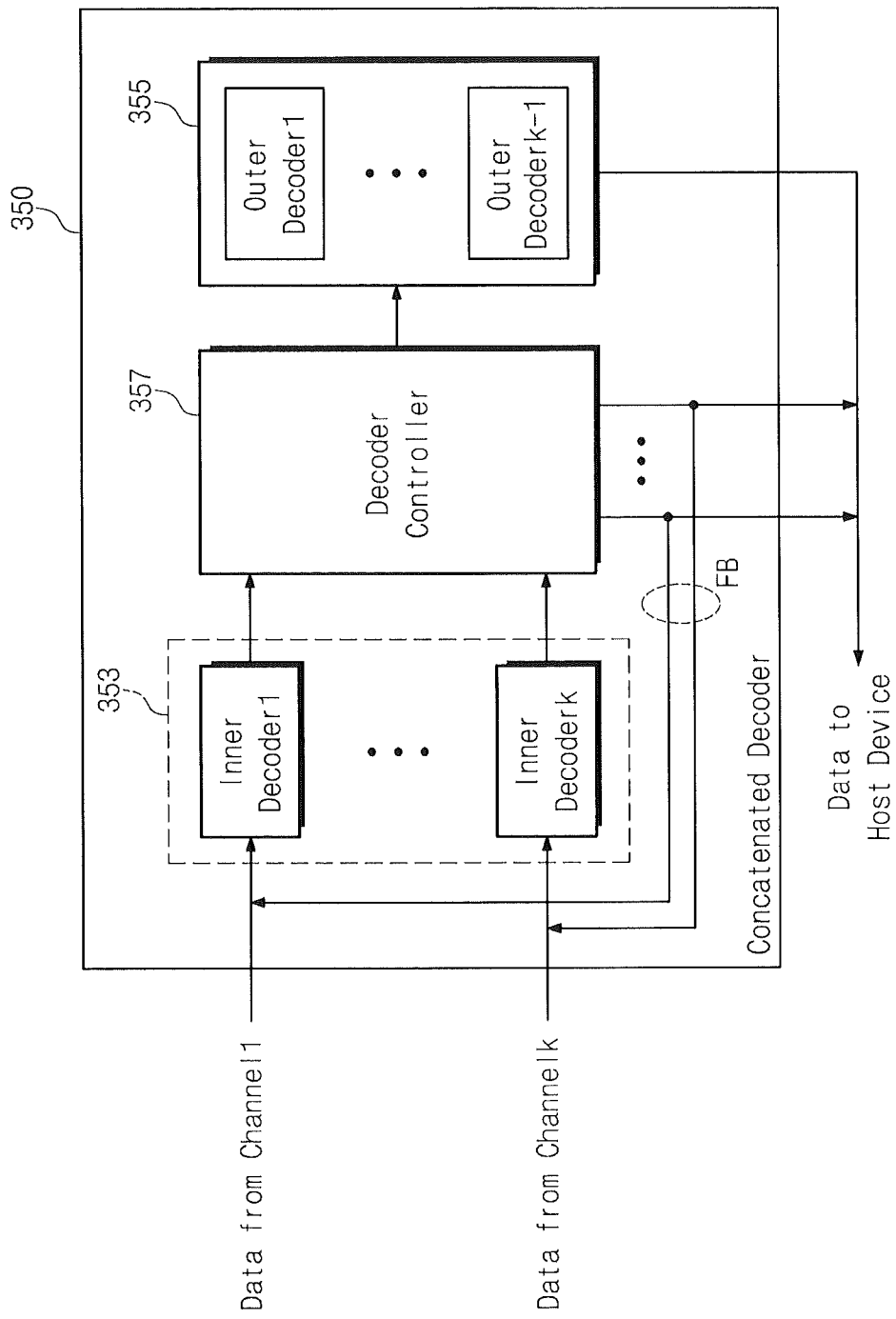
FIG. 7 is a block diagram of a concatenated decoder according to second embodiments of inventive concepts.

FIG. 7 is a block diagram of a concatenated decoder according to second embodiments of inventive concepts. Referring to FIG. 7, a concatenated decoder 350 may be configured to iteratively perform an inner decoding operation. For iterative inner decoding, a feedback loop FB controlled by a decoder controller 357 may be provided. Except for the above-described difference, the concatenated decoder 350 according to second embodiments of inventive concepts is identical to decoder 150 according to first embodiments of inventive concepts, and repetitive description thereof is thus omitted.

The decoder controller 357 may decide an iteration of an inner decoding operation, based on a decoding result of an inner decoder 353. For example, if an error is not corrected by an inner decoding operation, the decoder controller 357 controls the inner decoder 353 to iteratively perform the inner decoding operation. The inner decoder 353 may be configured to use an LDPC code, a turbo code, etc. as an iterative code. Iterative inner decoding operations will be more fully described with reference to FIG. 8.

Figure 8:
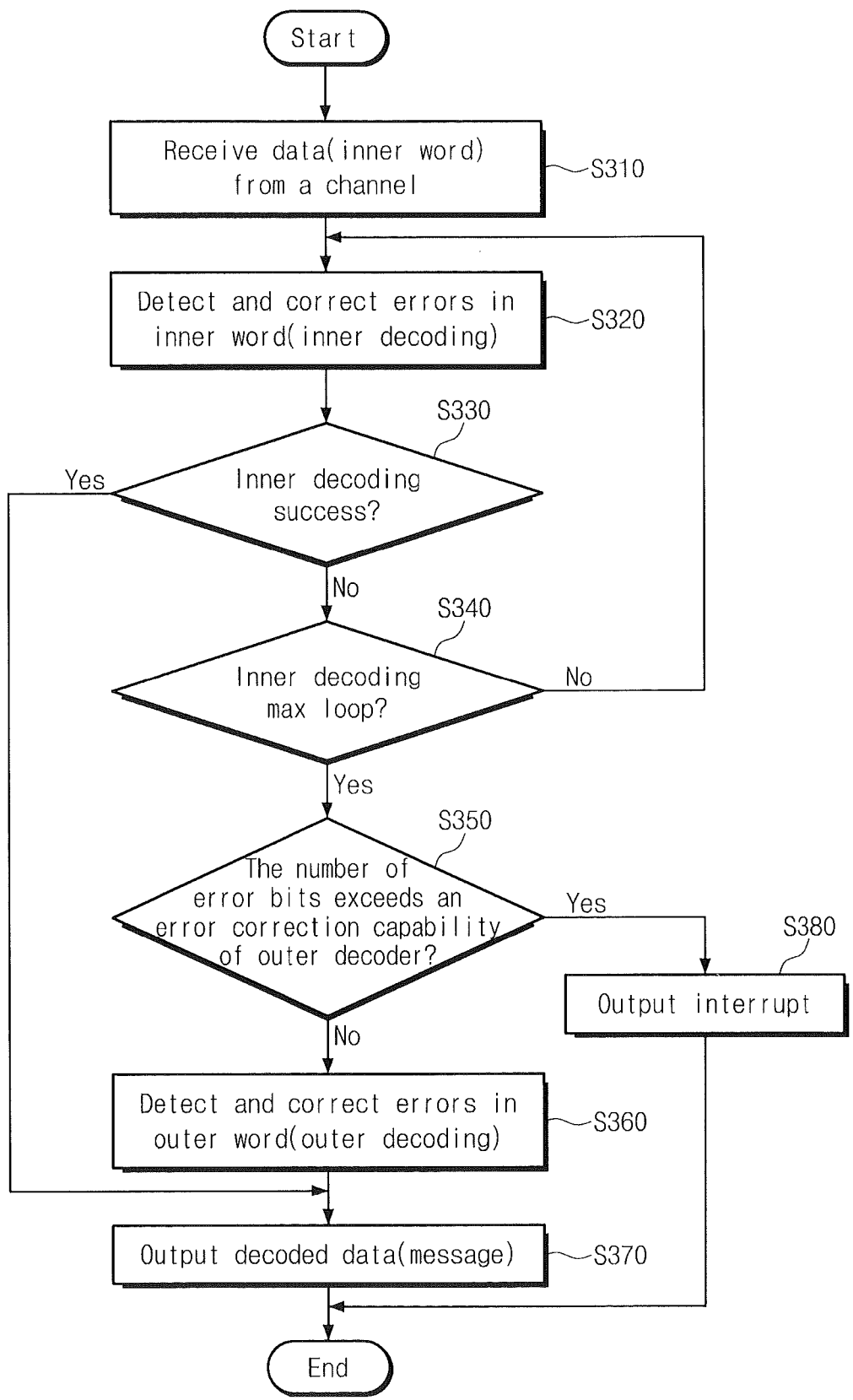
FIG. 8 is a flowchart illustrating decoding operations of a concatenated decoder according to second embodiments of inventive concepts.

FIG. 8 is a flowchart illustrating decoding operations of a concatenated decoder according to second embodiments of inventive concepts. Below, a decoding operation of a concatenated decoder according to second embodiments of inventive concepts will be more fully described with reference to accompanying drawings.

In operation S310, data (i.e., an inner word) including an error is provided to an inner decoder 353 from a channel. In operation S320, the inner decoder 353 decodes input data, that is, the inner word. For example, the inner decoder 353 detects and corrects errors of the inner word based upon inner parity data.

A decoder controller 357 controls a following decoding operation according to whether a decoding operation of the inner decoder 353 is successful, in operation S330. For example, in the event that no error is detected from data decoded by the inner decoder 353 or that the detected error is correctable, the decoder controller 357 controls such that an output of the inner decoder 353, (that is, an outer word) is not sent to an outer decoder 355. Afterwards, the decoder controller 357 outputs a message portion of the outer word to an external device (e.g., a host device) as decoded data (i.e., a message), in operation S370.

If an error of data decoded by the inner decoder 353 is not corrected, the decoder controller 357 again provides the output of the inner decoder 353, (that is, the outer word) to the inner decoder 353, in operation S340. In other words, the decoder controller 357 feeds back the output of the inner decoder 353 to the inner decoder 353 such that the inner decoding operation is performed iteratively. At this time, the inner decoding operation may be repeated up to a maximum loop number of a decoding manner of the inner decoder 353.

If the error of data decoded by the inner decoder 353 is not corrected after the inner decoding operation is iterated by the maximum loop number, in operation S350, the decoder controller 357 judges whether an erroneous bit number is within an error correction capacity of the outer decoder 355.

If an erroneous bit number is within the error correction capacity of the outer decoder 355, the decoder controller 357 provides a final output of the inner decoder 353 to an outer decoder 355. In operation S360, the outer decoder 355 decodes the uncorrected outer word. For example, the outer decoder 355 detects and corrects errors of the outer word based upon outer parity data. Afterwards, in operation S370, the outer decoder 355 outputs decoded data (i.e., a message) to an external device (e.g., a host device).

If the erroneous bit number exceeds the error correction capacity, the decoder controller 357 ends a decoding operation such that the outer decoding operation is not performed. In operation S380, the decoder controller 357 outputs an interrupt to the external device (e.g., the host device) and informs the external device that a decoding error has occurred.

According to second embodiments of inventive concepts, since the inner decoding operation is performed iteratively, an error correction capacity of the concatenated decoder 350 may be improved. Further, in a case where there is generated an error exceeding an error correction capacity of the outer decoder 355, since an outer decoding operation is skipped, a decoding process/time may be reduced. Like a concatenated decoder according to first embodiments of inventive concepts, a decoding operation of the outer decoder 355 may be skipped according to a decoding result of the inner decoder 353. Therefore, decoding operations may be reduced.

Figure 9:
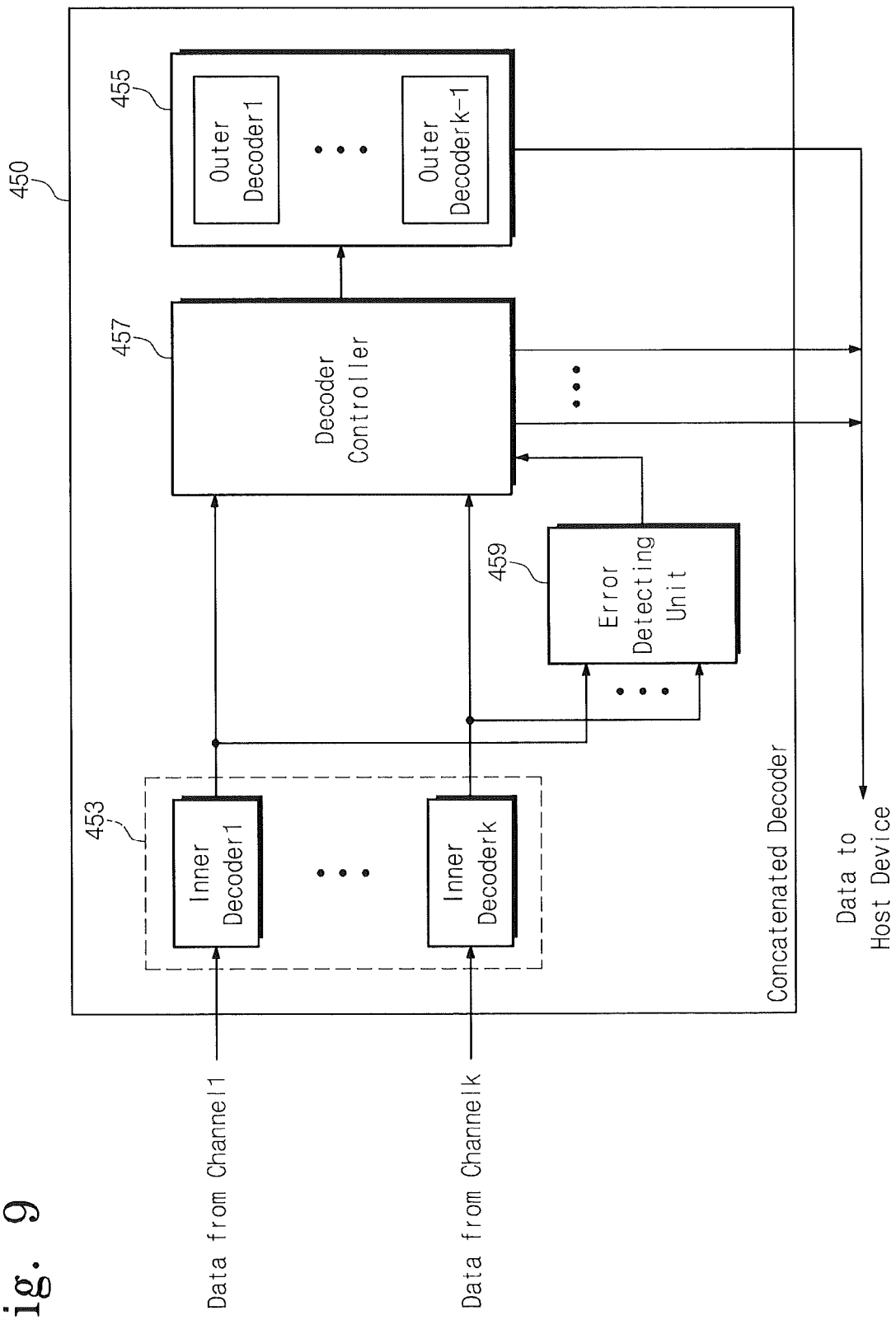
FIG. 9 is a block diagram of a concatenated decoder according to third embodiments of inventive concepts.

FIG. 9 is a block diagram of a concatenated decoder according to third embodiments of inventive concepts.

Referring to FIG. 9, a concatenated decoder 450 checks whether an inner decoding operation of an inner decoder 453 is performed successfully. For this, the concatenated decoder 450 includes an error detecting unit 459. Except for this difference, the concatenated decoder 450 is identical to decoder 150 according to first embodiments of inventive concepts, and repetitive description thereof may thus be omitted.

The error detecting unit 459 checks whether an inner decoding operation of the inner decoder 453 is performed successfully. For example, the error detecting unit 459 detects an error of an output of an inner decoder 453, that is, an error of an outer word. For this, the error detecting unit 459 can be configured to buffer the output of the inner decoder 453, that is, the outer word. By way of example, the error detecting unit 459 may perform a CRC operation.

Like the inner decoder 453, the error detecting unit 459 can be configured to include error detecting units corresponding to channels, respectively. As another embodiment, the error detecting unit 459 can be configured to include error detecting units of which the number is less than that of the channels.

It is well understood that data (e.g., an error detection code) for error detection can be added to an outer codeword generated by an outer encoder 133 in FIG. 1. Further, it is well comprehended that a device for adding such data (e.g., an error detection code) is provided within a concatenated encoder 130 in FIG. 1.

An operation of the error detecting unit 459 will be more fully described with reference to FIG. 10.

Figure 10:
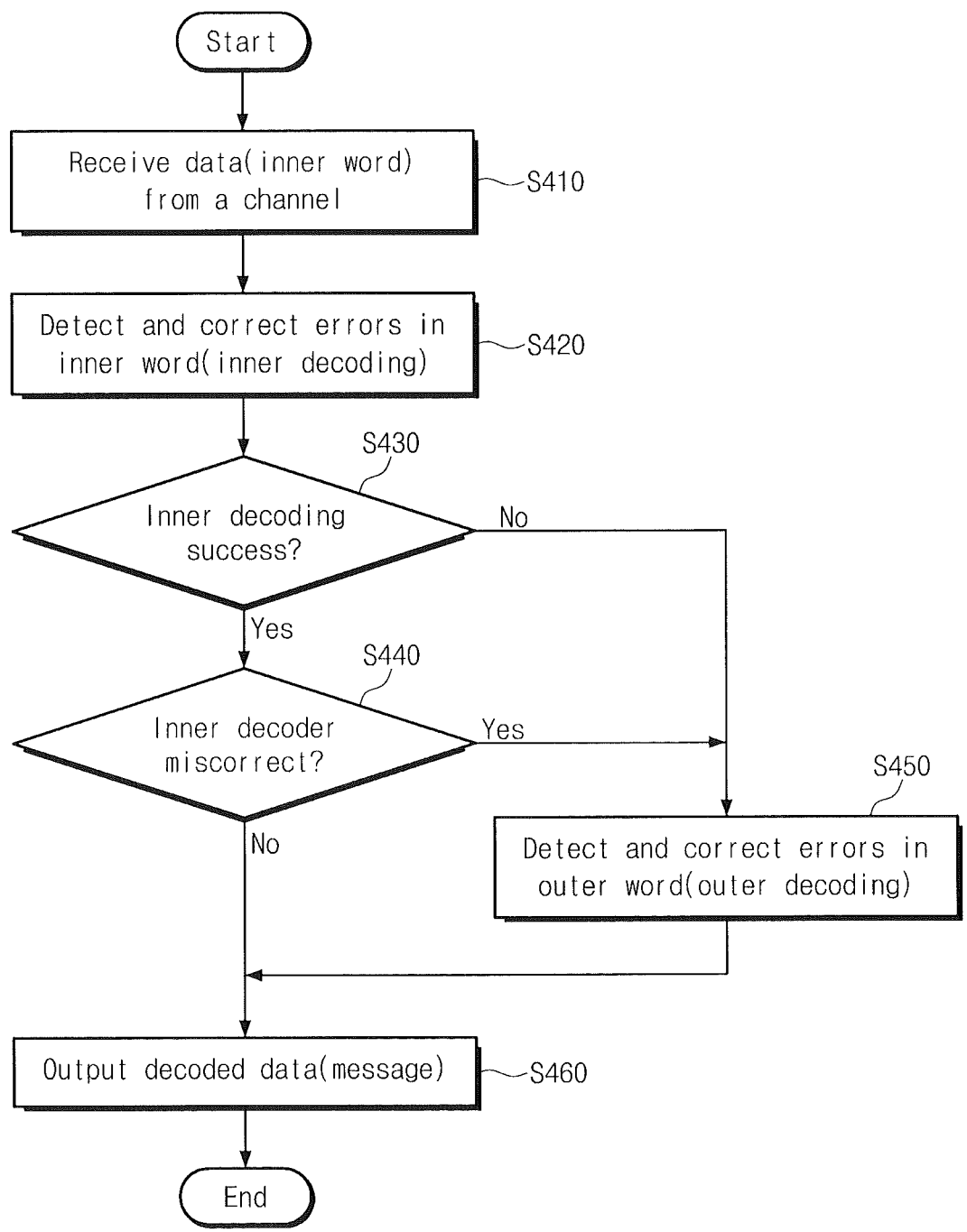
FIG. 10 is a flowchart illustrating decoding operations of a concatenated decoder according to third embodiments of inventive concepts.

FIG. 10 is a flowchart illustrating decoding operations of a concatenated decoder according to third embodiments of inventive concepts. Below, a decoding operation of a concatenated decoder according to third embodiments of inventive concepts will be more fully described with reference to FIG. 10.

In operation S410, data (i.e., an inner word) including an error is provided to an inner decoder 453 from a channel. In operation S420, the inner decoder 453 decodes input data, that is, the inner word. For example, the inner decoder 453 detects and corrects errors of the inner word based upon inner parity data.

A decoder controller 457 controls a following decoding operation according to whether a decoding operation of the inner decoder 453 is successful, in operation S430. For example, in the event that no error is detected from data decoded by the inner decoder 453 or that a detected error(s) is correctable, the decoder controller 457 controls such that an output of the inner decoder 453, (that is, an outer word) is not sent to an outer decoder 455. For example, the decoder controller 457 can buffer the outer word.

In operation S440, an error detecting unit 459 checks the outer word to judge whether an error correction operation of an inner decoder 453 is performed normally. The error detecting unit 459 provides the judgment result to the decoder controller 457. If an output of the error correcting unit 459 indicates that the error correction operation is performed normally, the decoder controller 457 outputs a message portion of the outer word to an external device (e.g., a host device) as decoded data (i.e., a message).

If an error of data decoded by the inner decoder 453 is not corrected, the decoder controller 457 provides an output of the inner decoder 453, that is, the outer word to an outer decoder 455. The outer decoder 455 decodes the outer word, that is, an uncorrected outer word, in operation S450. For example, the outer decoder 455 may detect and correct errors of the outer word based upon outer parity data. Afterwards, in operation S460, the outer decoder 455 outputs decoded data (i.e., a message) to the external device (e.g., the host device).

If an output of the error correcting unit 459 indicates that the error correction operation is performed abnormally, the decoder controller 457 provides the outer word to the outer decoder 455 although no error is detected from the decoded data or an error is corrected normally. In operation S450, the outer decoder 455 decodes the outer word. Afterwards, in operation S460, the outer decoder 455 outputs decoded data (i.e., a message) to the external device (e.g., the host device).

Meanwhile, in the outer decoding operation, the outer decoder 455 may inform the external device (e.g., the host device) of a decoding error when an error of the outer word is not corrected.

According to third embodiments of inventive concepts, although a result of an inner decoding operation indicates the case that an error is not detected from data or an error is corrected normally, the error detecting unit 459 checks whether an error correction operation of the inner decoder 453 is performed successfully. For this reason, an error correction capacity of the concatenated decoder 450 may be improved. Like a concatenated decoder according to second embodiments of inventive concepts, a decoding operation of the outer decoder 455 may be skipped according to a decoding result of the inner decoder 453. Therefore, decoding operations may be reduced.

Figure 11:
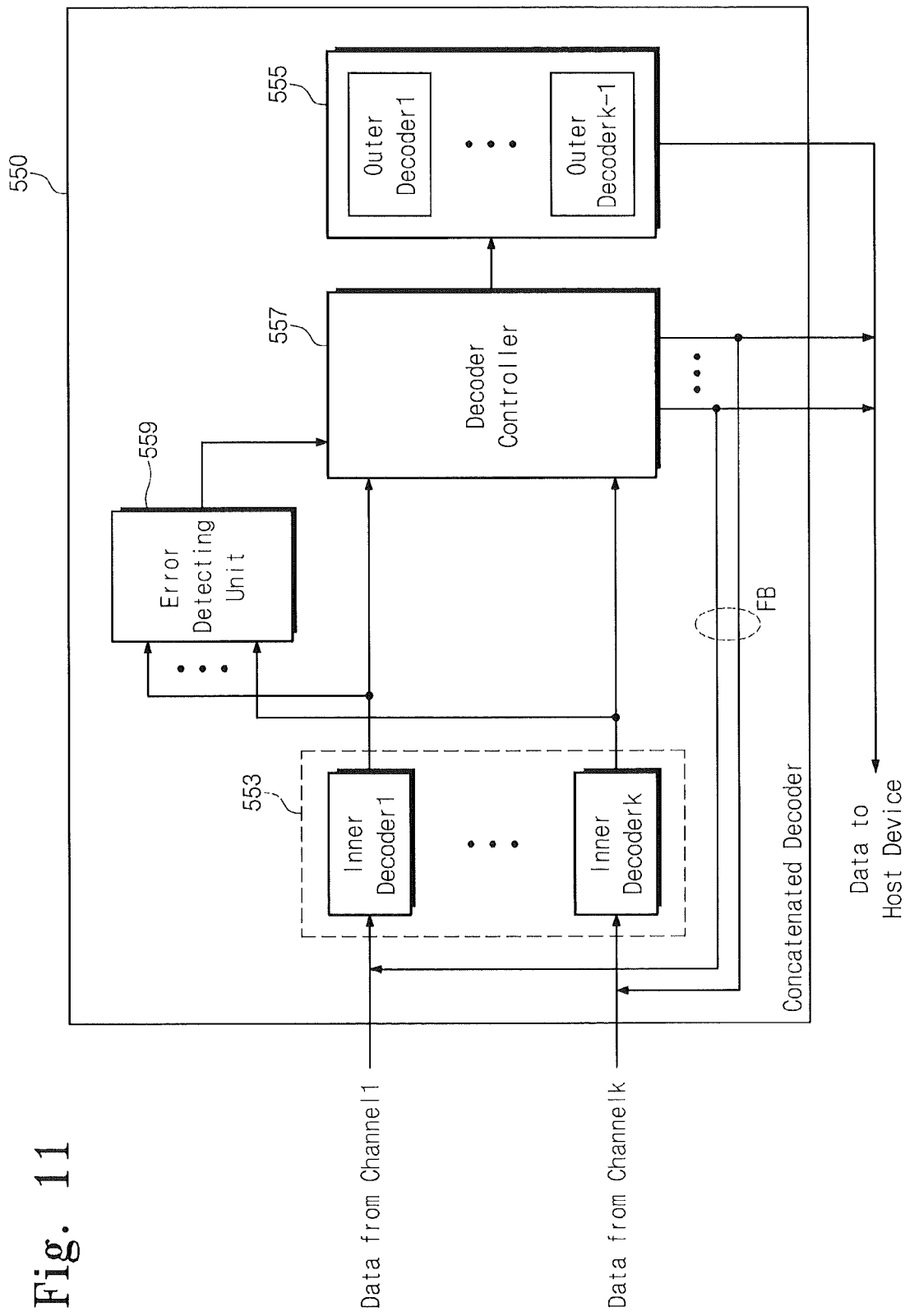
FIG. 11 is a block diagram of a concatenated decoder according to fourth embodiments of inventive concepts.

FIG. 11 is a block diagram of a concatenated decoder according to fourth embodiment of inventive concepts. Referring to FIG. 11, a concatenated decoder 550 may be configured to iteratively perform an inner decoding operation and to check whether the inner decoding operation is performed successfully. For this, the concatenated decoder 550 includes an error detecting unit 559 and a feedback loop FB. Except for the above-described difference, the concatenated decoder 550 in FIG. 11 is identical to decoder 150 according to first embodiments of inventive concepts, and repetitive description thereof is thus omitted.

A decoder controller 557 decides an iteration of an inner decoding operation according to a decoding result of an inner decoder 553. For example, if an error is not corrected by the inner decoding operation, the decoder controller 557 controls the inner decoder 553 such that the inner decoding operation is performed iteratively. At this time, the inner decoder 553 may be configured to use an LDPC code, a turbo code, and etc. as an iterative code.

The error detecting unit 559 checks whether the inner decoding operation of the inner decoder 553 is performed successfully. For example, the error detecting unit 559 detects an error of an output of the inner decoder 553, that is, an outer word. For this, the error detecting unit 559 can buffer the output of the inner decoder 553, that is, the outer word. For example, the error detecting unit 459 performs a CRC operation.

Like the inner decoder 553, the error detecting unit 559 can be formed of error detecting units each assigned to channels CH1 to CHk in FIG. 1. As another example, the error detecting unit 559 can be formed of error detecting units of which the number is less than that of the channels CH1 to CHk.

It is well understood that data (e.g., an error detection code) for error detection can be added to an outer codeword generated by an outer encoder 133 in FIG. 1. Further, it is well comprehended that a device for adding such data (e.g., an error detection code) is provided within a concatenated encoder 130 in FIG. 1.

An operation of the error detecting unit 459 and an iterative inner decoding operation will be more fully described with reference to FIG. 12.

Figure 12:
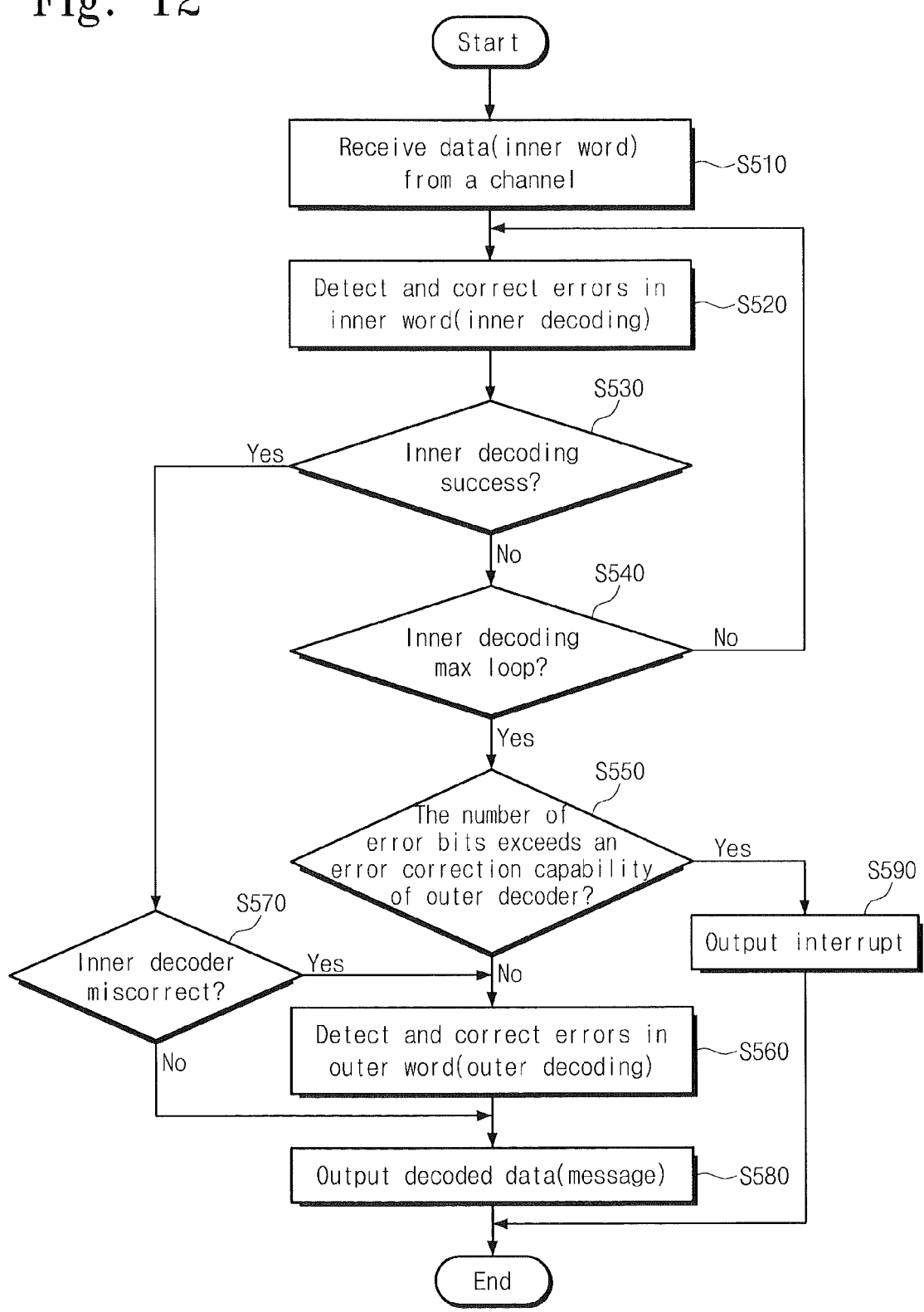
FIG. 12 is a flowchart illustrating decoding operations of a concatenated decoder according to fourth embodiments of the inventive concepts.

FIG. 12 is a flowchart illustrating decoding operations of a concatenated decoder according to fourth embodiments of inventive concepts. Below, a decoding operation of a concatenated decoder according to fourth embodiments of inventive concepts will be more fully described with reference to accompanying drawings.

In operation S510, data (i.e., an inner word) including an error is provided to an inner decoder 553 from a channel. In operation S520, the inner decoder 553 decodes input data, that is, the inner word. For example, the inner decoder 553 detects and corrects errors of the inner word based upon inner parity data.

A decoder controller 557 controls a following decoding operation according to whether a decoding operation of the inner decoder 353 is successful, in operation S530. For example, in the event that no error is detected from data decoded by the inner decoder 553 or that the detected error is correctable, the decoder controller 557 controls such that an output of the inner decoder 553, (that is, an outer word) is not sent to an outer decoder 555. For example, the decoder controller 557 can buffer the outer word.

In operation S570, an error detecting unit 559 checks the outer word to judge whether an error correction operation of an inner decoder 553 is performed normally. The error detecting unit 559 provides the judgment result to the decoder controller 557. If an output of the error correcting unit 559 indicates that the error correction operation is performed normally, in operation S580, the decoder controller 557 outputs a message portion of the outer word to an external device (e.g., a host device) as decoded data (i.e., a message).

If an error of data decoded by the inner decoder 553 is not corrected, the decoder controller 557 again provides the output of the inner decoder 353, that is, the outer word to the inner decoder 553, in operation S540. In other words, the decoder controller 557 feeds back the output of the inner decoder 553 to the inner decoder 553 such that the inner decoding operation is performed iteratively. At this time, the inner decoding operation may be repeated a maximum loop number of a decoding manner of the inner decoder 553.

If an error of data decoded by the inner decoder 353 is not corrected after the inner decoding operation is iterated by the maximum loop number, in operation S350, the decoder controller 557 judges whether an erroneous bit number is within an error correction capacity of the outer decoder 555.

If an erroneous bit number is within the error correction capacity of the outer decoder 555, the decoder controller 557 provides a final output of the inner decoder 553 to an outer decoder 555, In operation S560, the outer decoder 555 decodes the uncorrected outer. For example, the outer decoder 555 detects and corrects errors of a message based upon outer parity data. Afterwards, in operation S580, the outer decoder 555 outputs decoded data (i.e., a message) to an external device (e.g., a host device).

If the erroneous bit number exceeds the error correction capacity of the outer decoder 555, the decoder controller 557 ends a decoding operation such that the outer decoding operation is not performed. In operation S590, the decoder controller 557 outputs an interrupt to the external device (e.g., the host device) to provide notification that a decoding error occurred.

Meanwhile, if an output of the error correcting unit 559 indicates that the error correction operation is performed abnormally, the decoder controller 557 provides the outer word to the outer decoder 555 even though no error is detected from the decoded data or an error is corrected normally. In operation S560, the outer decoder 555 decodes the outer word. Afterwards, in operation S580, the outer decoder 555 outputs decoded data (i.e., a message) to the external device (e.g., the host device).

Meanwhile, in the outer decoding operation, the outer decoder 555 may inform the external device (e.g., the host device) of a decoding error when an error of the outer word is not corrected.

According to fourth embodiments of inventive concepts, since the inner decoding operation is performed iteratively, an error correction capacity of the concatenated decoder 550 may be improved. Further, in a case where there is generated an error exceeding an error correction capacity of the outer decoder 355, an outer decoding operation may be skipped, so that a decoding process/time may be reduced. Further, although a result of an inner decoding operation indicates the case that an error is not detected from data or an error is corrected normally, the error detecting unit 559 checks whether an error correction operation of the inner decoder 553 is performed successfully. For this reason, an error correction capacity of the concatenated decoder 550 may improved. Like a concatenated decoder according to first embodiments of inventive concepts, a decoding operation of the outer decoder 555 may be skipped according to a decoding result of the inner decoder 553. Therefore, decoding operations may be reduced.

Figure 13:
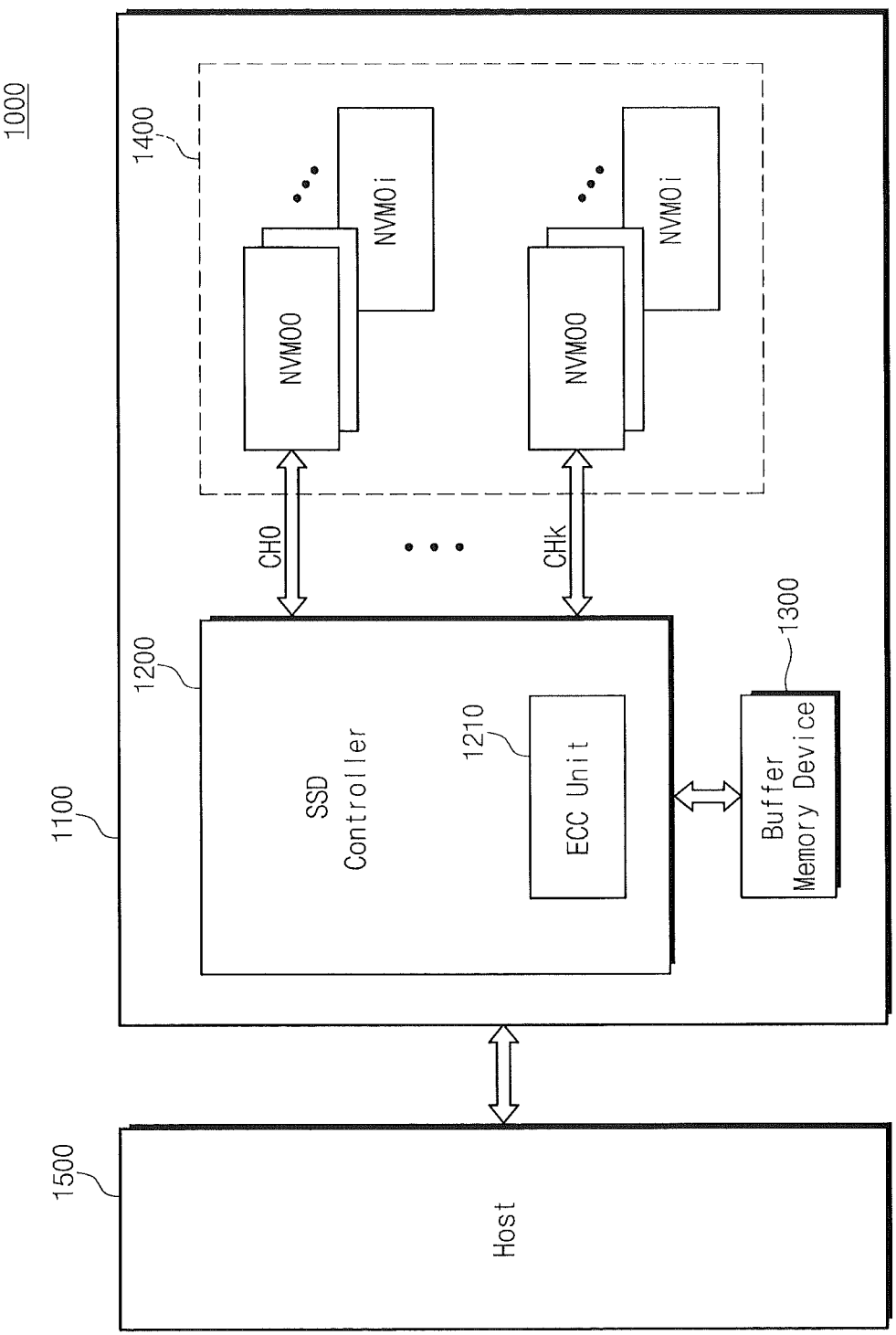
FIG. 13 is a block diagram of another user device including a concatenated encoder and decoder according to examples of embodiments of inventive concepts.

FIG. 13 is a block diagram of another user device including concatenated encoder and decoder according to examples of embodiments of inventive concepts.

Referring to FIG. 13, a user device 1000 may include a data storage device 1100 and a host device 1500. The data storage device 1100 may be a solid state drive (SSD). The SSD 1100 may include an SSD controller 1200, a buffer memory device 1300, and storage medium 1400. The SSD 1100 according to an example of some embodiments of inventive concepts may further include an auxiliary power supply having super capacitors. The auxiliary power supply may power the SSD 1100 at sudden power-off such that an operation of the SSD 1100 may end normally.

The SSD 1100 may operate responsive to an access request of the host 1500. That is, the SSD controller 1200 may respond to a request from the host 1500 to access the storage medium 1400. For example, the SSD controller 1200 may be configured to control read, write and erase operations of the storage medium 1400. The buffer memory device 1300 may temporarily store data to be stored in the storage medium 1400. Further, the buffer memory device 1300 may temporarily store data read out from the storage medium 1400. Data stored in the buffer memory device 1300 may be transferred to the storage medium 1400 or the host 1500 according to the control of the SSD controller 1200.

The SSD controller 1200 is connected with the storage medium 1400 via a plurality of channels CH0 to CHk, each of which is connected with a plurality of non-volatile memory devices NVM00 to NVM0$i$. A plurality of non-volatile memory devices may share a channel. The storage medium 1400 may be formed of a NAND flash memory device(s) according to some examples of embodiments of inventive concepts. The storage medium 1400, however, is not limited to NAND flash memory devices. For example, the storage medium 1400 may be formed of one or more of non-volatile memory devices such as NOR flash memory devices, phase-change RAM (PRAM) devices, ferroelectric RAM (FRAM) devices, magnetic RAM (MRAM) devices, and so on.

The SSD controller 1200 includes an ECC unit 1210. The ECC unit 1210 may include a concatenated encoder and decoder according to some embodiments of inventive concepts. The ECC unit 1210 may perform encoding and decoding operations which are described with respect to FIGS. 1 to 12, and repetitive description thereof is thus omitted.

Figure 14:
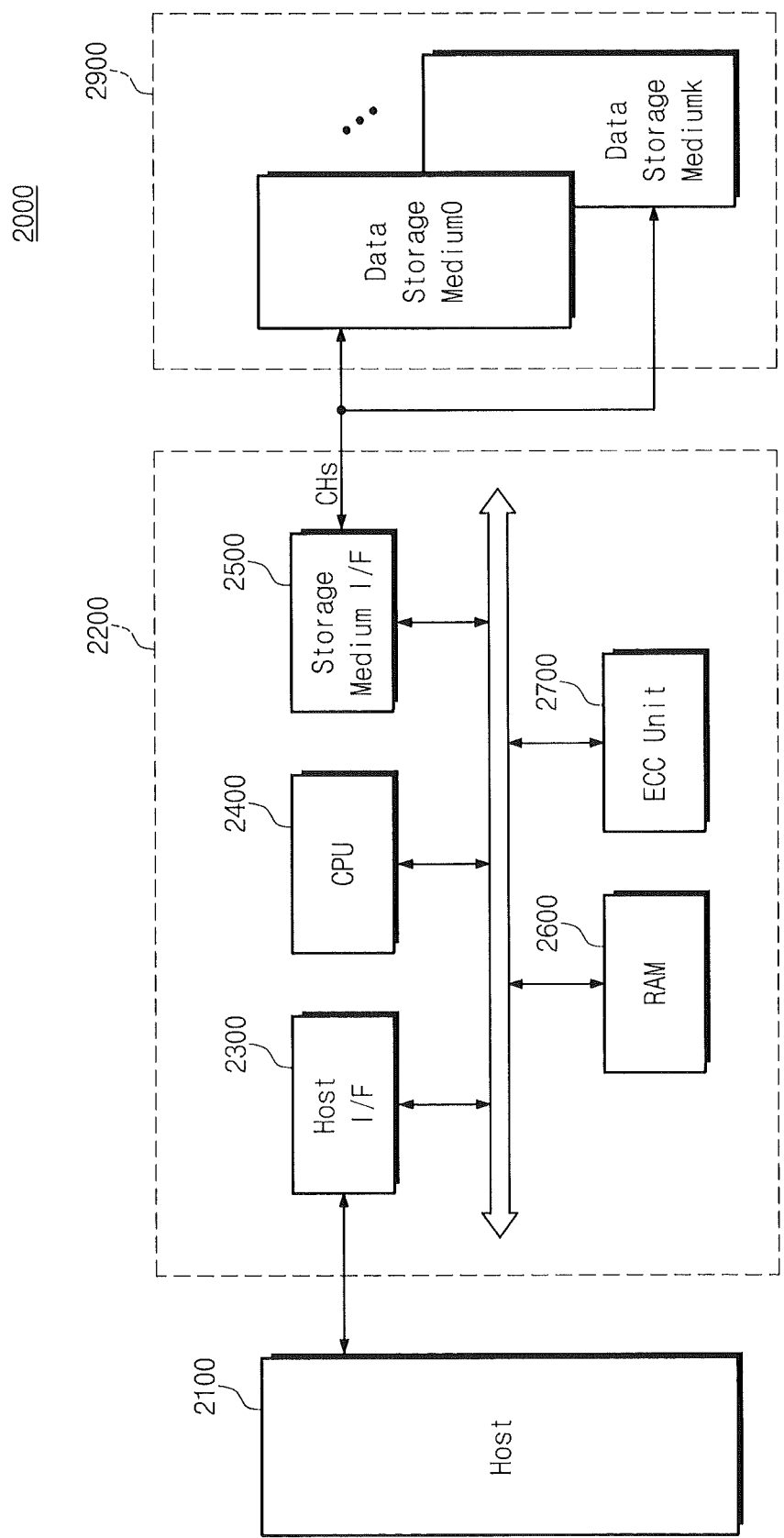
FIG. 14 is a block diagram of still another user device including a concatenated encoder and decoder according to examples of embodiments of inventive concepts.

FIG. 14 is a block diagram of still another user device including a concatenated encoder and decoder according to some examples of embodiments of inventive concepts.

Referring to FIG. 14, a user device 2000 includes a host device 2100 and a data storage device. The data storage device includes a controller 2200 and data storage media 2900 formed of a plurality of data storage medium.

The controller 2200 is connected to the host 2100 and the data storage media 2900. The controller 2200 responds to a request of the host 2100 to access the data storage media 2900. For example, the controller 2200 may be configured to control read, write, and erase operations of the data storage media 2900. The controller 2200 is configured to provide an interface between the data storage media 2900 and the host 2100. The controller 2200 is configured to drive firmware to control the data storage media 2900.

The controller 2200 may include constituent elements such as a RAM 2600, a CPU 2400, a host interface 2300, an ECC unit 2700, and a data storage medium interface 2500. The RAM 2600 may be used as a working memory of the CPU 2400. The CPU 2400 may control an overall operation of the controller 2200.

The host interface 2300 may include a protocol to execute data exchange between the host 2100 and the controller 2200. For example, the memory controller 2200 may be configured to communicate with an external device (for example, a host) through at least one of various interface protocols such as a Universal Serial Bus (USB) protocol, a MultiMedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, etc.

The ECC unit 2700 is configured to detect an error of data read out from the data storage media 2900 and to correct the detected error. The ECC unit 2700 may include a concatenated encoder and a concatenated decoder according to embodiments of inventive concepts. The ECC unit 2700 may perform encoding and decoding operations described in FIGS. 1 to 12, and repetitive description thereof is thus omitted.

The data storage medium interface 2500 may provide an interface between the data storage media 2900 and the controller 2200.

It is well understood that the controller 2200 is not limited to embodiments of this disclosure. For example, the controller 2200 may further include a ROM which stores code data used for an initial booting operation and data used for interface with the host 2100.

The controller 2200 and the data storage media 2900 may be integrated in a single semiconductor device to form a memory card such as a PCMCIA (personal computer memory card international association) card, a CF (compact flash) card, a smart media card, a memory stick, a multimedia card (e.g., MMC, RS-MMC, MMC-micro, etc.), an SD card (e.g., SD, Mini-SD, Micro-SD, SDHC, etc.), UFS(universal flash storage), etc.

In some embodiments, the controller 2200 and the data storage media 2900 may be used as a solid state drive (SSD), a computer, a portable computer, an Ultra Mobile PC (UMPC), a workstation, a net-book, a PDA, a web tablet, a wireless phone, a mobile phone, a smart phone, an e-book, a PMP (portable multimedia player), a digital camera, a digital audio recorder/player, a digital picture/video recorder/player, a portable game machine, a navigation system, a black box, a 3-dimensional television, a device capable of transmitting and receiving information at a wireless circumstance, one of various electronic devices constituting home network, one of various electronic devices constituting computer network, one of various electronic devices constituting telematics network, RFID, an embedded system, or one of various electronic devices constituting a computing system.

In some embodiments, the controller 2200 or the data storage media 2900 may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), etc.

Figure 15:
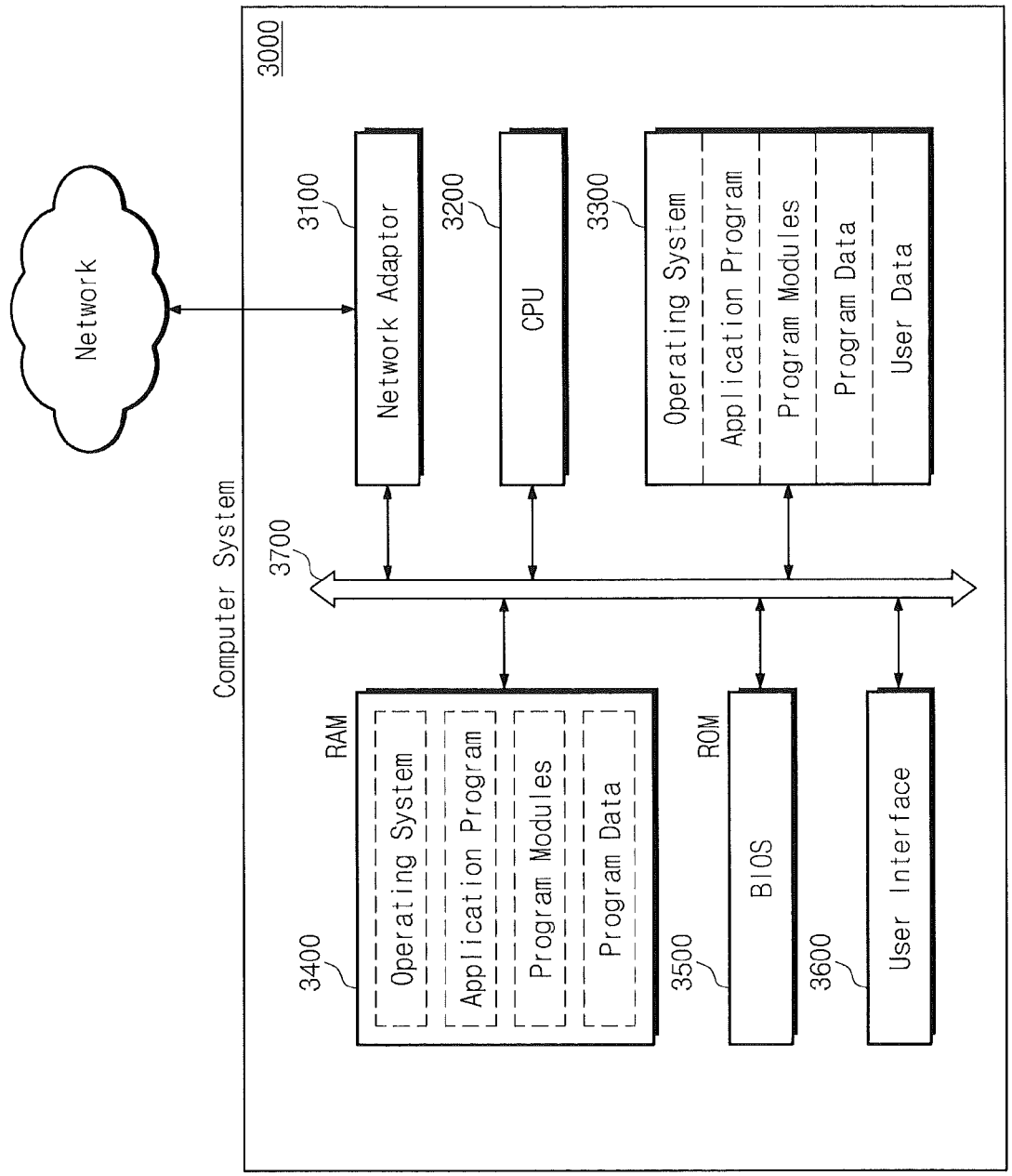
FIG. 15 is a block diagram of a computing system including a data processing system in FIG. 13.

FIG. 15 is a block diagram of a computing system including a data processing system in FIG. 13.

A computer system 3000 may include a network adaptor 3100, a CPU 3200, a data storage device 3300, a RAM 3400, a ROM 3500, and a user interface 3600 which are electrically connected to a system bus 3700. Herein, the data storage device 3300 may be formed of a data storage device in FIG. 13. Alternatively, the data storage device 3300 may be formed of a data storage device in FIG. 14.

The network adaptor 3100 may provide an interface between the computer system 3000 and external networks. The CPU 3200 may control an overall operation to drive an operating system and an application program which are resident on the RAM 3400. The data storage device 3300 stores data used by the computer system 3000. For example, the data storage device 3300 may store an operating system used to drive the computer system 3000, an application program, various program modules, program data, user data, etc.

The RAM 3400 is used as a working memory of the computer system 3000. Upon booting, the operating system, the application program, the various program modules, and program data used to drive programs and various program modules read out from the data storage device 3300 is loaded on the RAM 3400. The ROM 3500 stores a basic input/output system (BIOS) which is activated before the operating system is driven upon booting. Information exchange between the computer system 3000 and a user is made via the user interface 3600.

In addition, the computer system 3000 may further include a battery, a modem, etc. Although not shown in FIG. 15, the computer system 3000 may further include an application chipset, a camera image processor (CIS), a mobile DRAM, and etc.

The above-disclosed subject matter is to be considered illustrative, and not restrictive, and the appended claims are intended to cover all such modifications, enhancements, and other embodiments, which fall within the true spirit and scope of inventive concepts disclosed herein. Thus, to the maximum extent allowed by law, the scope is to be determined by the broadest permissible interpretation of the following claims and their equivalents, and shall not be restricted or limited by the foregoing detailed description.

What is claimed is:

1. A solid state drive of a data processing system, the solid state drive comprising:
    a plurality of memory channels of the solid state drive configured to store data, wherein each memory channel includes a plurality of nonvolatile memory storage devices; and
    a concatenated decoder coupled to the plurality of memory channels of the solid state drive, wherein the concatenated decoder is configured to detect and correct errors of inner words and outer words transferred from the plurality of memory channels, wherein the concatenated decoder comprises,
        an inner decoder configured to decode the inner words to output the outer words each formed of a message and parity data on the message;
        an outer decoder configured to decode the outer words to output decoded messages to an external device; and
        a decoder controller configured to control the inner and outer decoders, wherein the decoder controller is configured to extract the messages from the outer words to output the messages to the external device without processing through the outer decoder when a decoding operation of the inner decoder is performed successfully,
        wherein the decoder controller is configured to provide an output of the inner decoder to an input of the inner decoder and the inner decoder is configured to iteratively perform the decoding operation up to a maximum loop number when the decoder operation of the inner decoder fails,
        wherein if the decoding operation of the inner decoder fails after the inner decoding operation is iterated by the maximum loop number, the decoder controller is configured to provide the output of the inner decoder to the outer decoder,
        wherein the inner decoder includes a plurality of inner decoders each corresponding to a respective one of the memory channels of the solid state drive, wherein the outer decoder includes a plurality of outer decoders, and wherein the plurality of outer decoders includes a number of the outer decoders that is less than a number of the memory channels of the solid state drive and that is less than a number of the inner decoders.

2. The solid state drive of claim 1, wherein the decoder controller is configured to decide a decoding order of the outer words output from the inner decoder according to a priority of the outer words, and to provide the outer words to the outer decoders according to the decoding order.

3. The solid state drive of claim 1, wherein a decoding technique of the inner decoder is different from a decoding technique of the outer decoder.

4. The solid state drive of claim 3, wherein the inner decoder uses one of a BCH (Bose, Chaudhuri, Hocquenghem) code, an RS (Reed-Solomon) code, a convolutional code, an LDPC (Low Density Parity Check) code, or a turbo code.

5. The solid state drive of claim 3, wherein the outer decoder uses one of a BCH (Bose, Chaudhuri, Hocquenghem) code, an RS (Reed-Solomon) code, or a CRC (cyclic redundancy check) code.

6. The solid state drive of claim 1, wherein the concatenated decoder further includes an error detecting unit configured to check whether errors of the outer words output from the inner decoder are corrected normally.

7. The solid state drive of claim 6, wherein the decoder controller is configured to provide the outer words to the outer decoder when a checking result of the error detecting unit indicates that an error correction operation fails.

8. The solid state drive of claim 1, further comprising:
a concatenated encoder configured to encode data to be transferred respectively through the memory channels, wherein the concatenated encoder includes an outer encoder configured to generate outer codewords by encoding data to be transferred respectively via the memory channels, and an inner encoder configured to generate inner codewords by encoding the outer codewords.

9. The solid state drive of claim 1 wherein the decoder controller is configured to decide a decoding order of the outer words output from the inner decoder according to a priority of the outer words, and to provide the outer words to the outer decoders according to the decoding order.

10. The solid state drive of claim 1 wherein the nonvolatile memory storage devices of a respective memory channel comprise NAND flash memory devices.

11. A solid state drive of a data processing system, the solid state drive comprising:
a plurality of memory channels of the solid state drive configured to store data, wherein each memory channel includes a plurality of nonvolatile memory storage devices; and
a concatenated decoder coupled to the plurality of memory channels of the solid state drive, wherein the concatenated decoder is configured to detect and correct errors of inner words and outer words transferred from the plurality of memory channels, wherein the concatenated decoder comprises,
an inner decoder configured to decode the inner words to output the outer words each formed of a message and parity data on the message;
an outer decoder configured to decode the outer words to output decoded messages to an external device; and
a decoder controller configured to control the inner and outer decoders, wherein the decoder controller is configured to extract the messages from the outer words to output the messages to the external device without processing through the outer decoder when a decoding operation of the inner decoder is performed successfully,
wherein the inner decoder includes a plurality of inner decoders each corresponding to a respective one of the memory channels of the solid state drive, wherein the outer decoder includes a plurality of outer decoders, and wherein the plurality of outer decoders includes a number of the outer decoders that is less than a number of the memory channels of the solid state drive and that is less than a number of the inner decoders.

* * * * *